United States Patent
Glovatsky et al.

(10) Patent No.: US 7,510,400 B2
(45) Date of Patent: Mar. 31, 2009

(54) LED INTERCONNECT SPRING CLIP ASSEMBLY

(75) Inventors: Andrew Z. Glovatsky, Plymouth, MI (US); Jeff C. Lin, Novi, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 0 days.

(21) Appl. No.: 11/686,101

(22) Filed: Mar. 14, 2007

(65) Prior Publication Data

US 2008/0224166 A1 Sep. 18, 2008

(51) Int. Cl.
*H01R 12/00* (2006.01)

(52) U.S. Cl. .................... 439/56; 439/699.2; 362/800

(58) Field of Classification Search ............. 439/56, 439/68, 626, 699.2; 362/800
See application file for complete search history.

(56) References Cited

U.S. PATENT DOCUMENTS

| | | | |
|---|---|---|---|
| 4,247,864 A | 1/1981 | Lockard | |
| 4,353,109 A | 10/1982 | Weber | |
| 4,573,754 A | 3/1986 | Hill | |
| 4,631,651 A | 12/1986 | Bergin et al. | |
| 5,800,183 A | 9/1998 | Paul et al. | |
| 6,270,355 B1 | 8/2001 | Kihara | |
| 6,682,211 B2 | 1/2004 | English et al. | |
| 6,733,711 B2 | 5/2004 | Durocher et al. | |
| 6,840,776 B2 | 1/2005 | Sørensen et al. | |
| 7,019,335 B2 | 3/2006 | Suenaga | |
| 7,045,905 B2 | 5/2006 | Nakashima | |
| 7,070,418 B1 | 7/2006 | Wang | |
| 7,083,305 B2 * | 8/2006 | Galli ..................... 362/294 | |
| 7,098,588 B2 | 8/2006 | Jäger et al. | |
| 7,150,553 B2 | 12/2006 | English et al. | |
| 7,161,189 B2 * | 1/2007 | Wu ........................ 257/98 | |
| 7,186,010 B2 | 3/2007 | Coushaine et al. | |
| 7,255,823 B1 | 8/2007 | Guenther et al. | |
| 7,322,828 B1 | 1/2008 | Chiang et al. | |
| 2004/0000727 A1 | 1/2004 | Hsu | |
| 2004/0175189 A1 | 9/2004 | Weber-Rabsilber et al. | |
| 2004/0222433 A1 | 11/2004 | Mazzochette et al. | |
| 2004/0227146 A1 | 11/2004 | Wu | |
| 2004/0240229 A1 | 12/2004 | Blumel et al. | |
| 2005/0047157 A1 | 3/2005 | Reiss | |

(Continued)

FOREIGN PATENT DOCUMENTS

JP 2000-188425 4/2000

OTHER PUBLICATIONS

Nichia Corporation, Technical Specification entitled "Thermal Management Design of LEDs";Oct. 31, 2003; http://www.nichia.co.jp/product/led_top.html.

(Continued)

*Primary Examiner*—Khiem Nguyen
(74) *Attorney, Agent, or Firm*—Brinks Hofer Gilson & Lione

(57) ABSTRACT

An LED interconnect spring clip assembly includes a housing having a center cavity and a plurality of contact features. Each contact feature has a portion retained by the housing and another portion that is operable to contact a terminal of an LED package disposed within the center cavity of the housing. The LED interconnect spring clip assembly retains the LED package when mounted to a substrate.

20 Claims, 7 Drawing Sheets

U.S. PATENT DOCUMENTS

| | | |
|---|---|---|
| 2005/0205889 A1 | 9/2005 | Chen |
| 2005/0269589 A1 | 12/2005 | Wu |
| 2006/0002110 A1 | 1/2006 | Dowling et al. |
| 2006/0043401 A1 | 3/2006 | Lee et al. |
| 2006/0049420 A1 | 3/2006 | Liu |
| 2006/0076572 A1 | 4/2006 | Huber et al. |
| 2006/0138436 A1 | 6/2006 | Chen et al. |
| 2006/0145180 A1 | 7/2006 | Galli |
| 2006/0226774 A1 | 10/2006 | Sofue et al. |
| 2006/0249744 A1 | 11/2006 | Kim et al. |
| 2007/0057665 A1 | 3/2007 | Borst et al. |

OTHER PUBLICATIONS

Andreas Stich et al, OSRAM Opto Semiconductors, *Thermal Management of OSTAR® Projection Light Source*, Jan. 2006, pp. 1-16.

Andreas Stich et al, OSRAM Opto Semiconductors, *OSTAR®—Lighting*, May 2006, pp. 1-15.

Andreas Stich et al, OSRAM Opto Semiconductors, *Mounting Guideline for High Power Light Sources of the OSTAR® LED Product Family*, May 2006, pp. 1-4.

Office Action mailed Jul. 23, 2008 for U.S. Appl. No. 11/778,945 filed Jul. 17, 2007.

\* cited by examiner

LED INTERCONNECT SPRING CLIP ASSEMBLY

BACKGROUND

1. Field of the Invention

The present invention generally relates to light-emitting diode (LED) packaging. More specifically, the invention relates to high output ceramic mounted light-emitting diode (LED) packages for motor vehicle headlamp or other applications.

2. Description of Related Art

An LED is one type of semiconductor that generates light when voltage is applied to it. There are various advantages to using LEDs in vehicle headlamp applications, such as long lifetime, low drive voltage, high vibration resistance, and high tolerance of repeated power switching.

However, one problem with LEDs is that they require adequate heat sinking in order to preserve their long life. High output LED packages are subject to failure caused by, among other things, localized hotspots and thermal runaway. A high output LED die is operated with high drive currents resulting in high die or junction temperatures, in the range of 150 degrees Celsius or higher. When the substrate material reaches a high enough temperature, it expands and causes mechanical stresses in the bonded contact, weakening it. The reliability of the connections is limited on standard substrates such as FR4 or flexible circuits.

In view of the above, high output ceramic mounted LED packages are designed such as to be non-reflowable and with low coefficients of thermal expansions (CTEs). However, these design parameters make the assembly of the LED packages costly.

Solder interconnects have traditionally been used in LED packages. However, with high die and/or junction temperatures, solder interconnects have proven to be unreliable.

In view of the above, it is apparent that there exists a need for a connector for an LED package that provides reliable mechanical and electrical connections for LED terminals.

SUMMARY

In satisfying the above need, as well as overcoming the enumerated drawbacks and other limitations of the related art, the present invention provides an LED interconnect spring clip assembly including a housing having a center cavity formed therein and a plurality of contact features. The contact features are retained by the housing and are operable to contact electric terminals (LED terminals) of an LED package.

In another aspect, an LED interconnect spring clip assembly includes a housing having at least one center cavity formed therein and at least one LED package disposed within the center cavity. A plurality of contact features are connected to the housing, each contact feature having one end or portion retained by the housing and an exposed portion in electrical communication with an LED terminal of the LED package.

Further objects, features and advantages of this invention will become readily apparent to persons skilled in the art after a review of the following description, with reference to the drawings and claims that are appended to and form a part of this specification.

DETAILED DESCRIPTION

Figure 1:
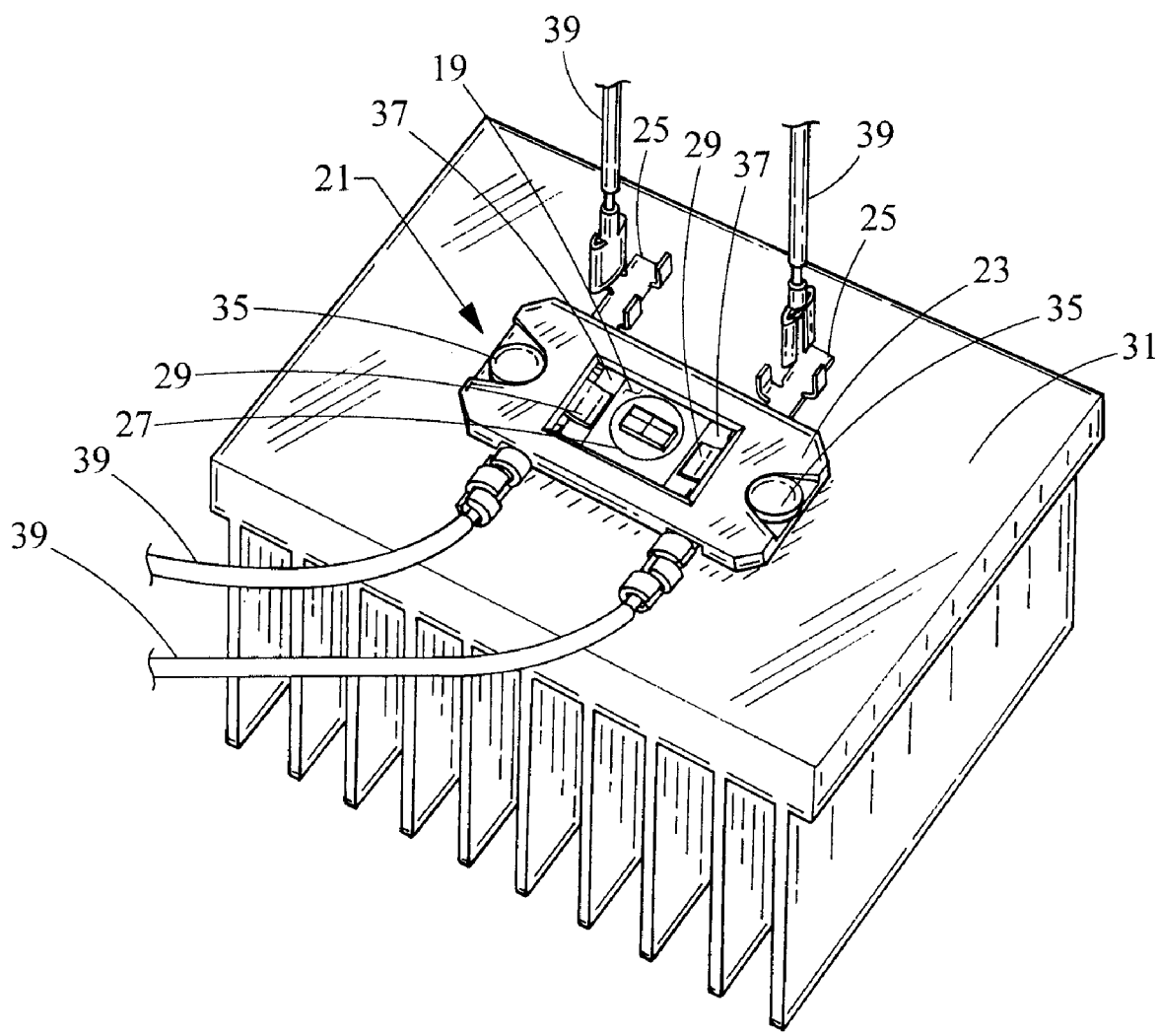
FIG. 1 is a perspective view of a spring clip assembly embodying the principles of the present invention.

Referring now to FIG. 1, an LED interconnect spring clip assembly embodying the principles of the present invention is illustrated therein and designated at 21. The LED interconnect spring clip assembly 21 has an electrically insulative housing 23, which retains two contact features, in the form of spring clips 25. Preferably, the spring clips 25 are molded into the housing 23; however, it is also contemplated that the spring clips 25 could be retained by the housing 23 in another way, such as by being snapped into place or otherwise being secured to the housing 23.

The LED interconnect spring clip assembly 21 has a center cavity 19 formed within the housing 23, in which an LED package 27 may be disposed. The LED package 27 has LED terminals 37, which are electric terminals operable to connect the LED package 27 within a circuit. When the LED interconnect spring clip assembly 21 is fastened to a heat sink 31, by fasteners such as screws 35, the spring clips 25 electrically connect the LED terminals 37 within a circuit. In this embodiment, the electrical connection occurs because the spring clips 25, which are formed of electrically conductive material, contact the LED terminals 37 via tabs 29, and the spring clips 25 are connected within a circuit through electrical leads 39.

Other features of this embodiment are similar to the features of the embodiment of FIGS. 2A-2C and 3A, as described in more detail below. For example, the housing 23 is preferably formed of high temperature plastic, and the spring clips 25 are preferably formed of metal; however, other materials may be used without falling beyond the spirit and scope of this invention.

Referring now to FIGS. 2A-2C and 3A, another embodiment of an LED interconnect spring clip assembly embodying the principles of the present invention is illustrated therein and designated at 20. The LED interconnect spring clip assembly 20 includes an electrically insulative housing 22 having contact features 24 molded therein. The housing 22 overlays an LED package 26, which protrudes through a center cavity or opening 28 of the housing 22. The LED package 26 is disposed upon a heat sink 30, which is typically disposed upon a secondary heat sink 32. Additionally, screws 34 are used to fasten the housing 22 to the heat sink 30 and the secondary heat sink 32, capturing the LED package 26 between the housing 22 and the heat sink 30.

The housing 22 is preferably made of high temperature plastic, such as Ultem 1000, manufactured by the General Electric Company, or Torlon, manufactured by Solvay Advanced Polymers. The housing 22 could also be made from another suitable plastic, insulative polymer, or other material that can withstand any thermal exposure from the LED package 26 and conduction through the contact features 24, LED terminals 36, and other parts of the circuit that it comes in contact with.

Figure 2A:
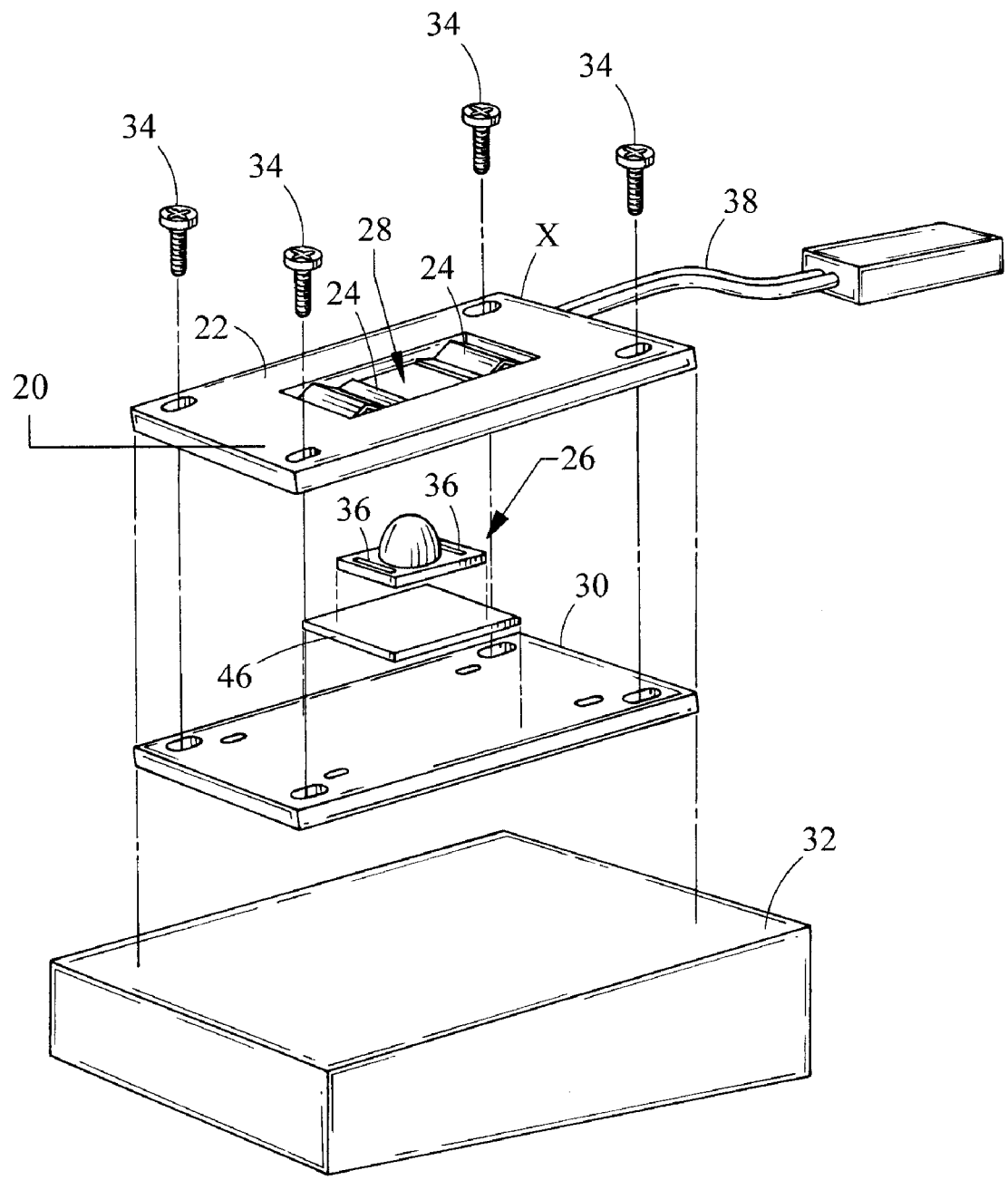
FIG. 2A is an exploded perspective view of another embodiment of an LED interconnect spring clip assembly embodying the principles of the present invention.
Figure 2B:
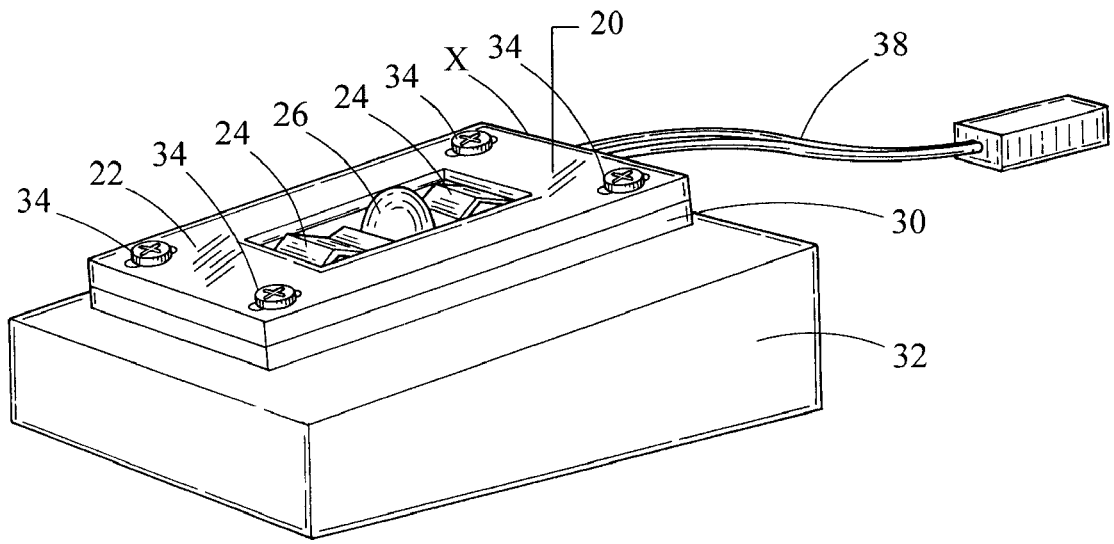
FIG. 2B is a perspective view of the LED interconnect spring clip assembly of FIG. 2A.
Figure 2C:
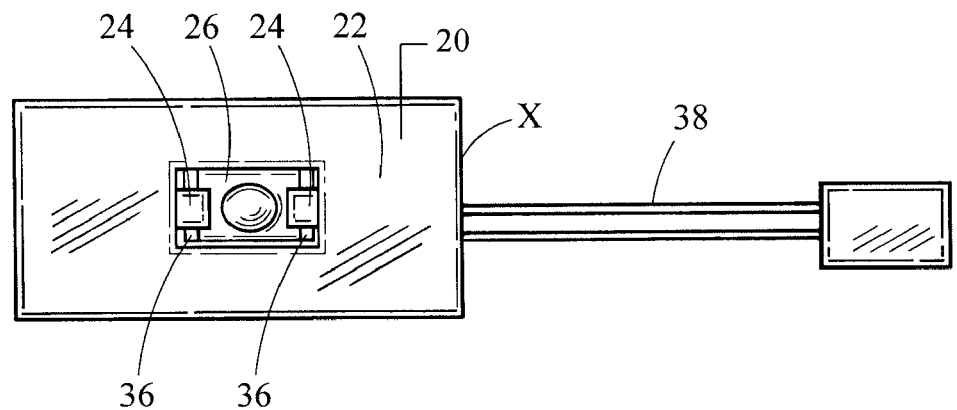
FIG. 2C is a plan view of the LED interconnect spring clip assembly of FIGS. 2A and 2B.

LED ceramic packages utilized with the present invention may be purchased in their assembled form, as one skilled in the art would know and appreciate. The contact features 24 of the LED spring clip assembly 20 contact LED terminals (electric terminals) 36 of the LED package 26, establishing both an electrical and a mechanical connection therewith, when the LED interconnect spring clip assembly 20 is fastened to the heat sink 30, as shown in FIGS. 2B and 2C. The contact features 24 are further connected to a wiring harness 38, which may further connect the LEDs within a circuit (not shown). This occurs by virtue of the contact features 24 extending through the housing 22 to reach an edge X of the housing 22, where they may be connected to the wiring harness 38. The connecting portions of the contact features 24, which connect to the wiring harness 38, may be in the form of leads, crimps, or other structures.

Figure 3A:
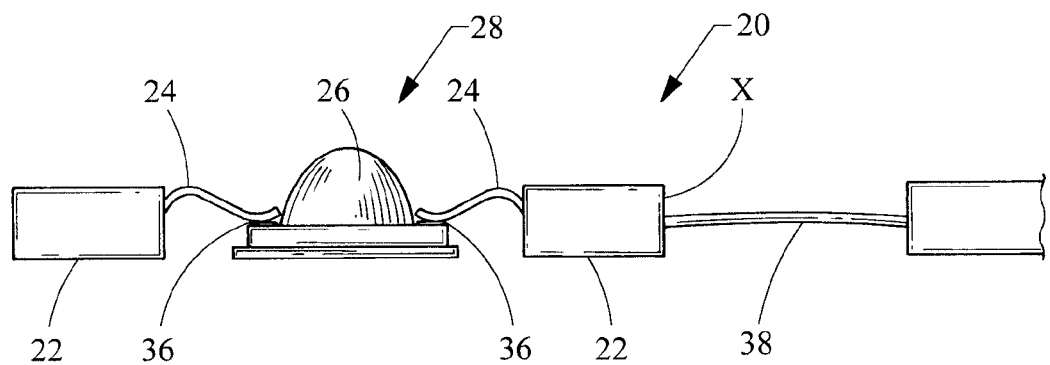
FIG. 3A is a cross-sectional view of the LED interconnect spring clip assembly of FIGS. 2A-2C.

As noted above, the contact features 24 have a portion molded into the housing 22 and have an exposed end located within the center cavity 28. The exposed ends of the contact features 24 of have corrugations, bends, or crimps therein. The corrugations of the contact features 24 provide a compression force to hold the LED package 26 in place when the LED interconnect spring clip assembly 20 fastened to a connecting surface, such as secondary heat sink 32. A cross-sectional view of the LED interconnect spring clip assembly 20 having corrugated contact features 24 is illustrated in FIG. 3A. Because the contact features 24 hold the LED package 26 in place, adhesives need not be relied upon to secure the LED package 26 in place, although it is contemplated and recommended that an adhesive material or thermally conductive material 46 be used in conjunction with the LED spring clip assembly 20. Additionally, or in the alternative, the heat sink 30 could contain a recess that helps locate the LED package 26 within a specific location. The recess in the heat sink 30 could further have retention features in the form of nubs located on each edge of the recess to retain the LED package 26 to the housing 22.

Furthermore, because the LED interconnect spring clip assembly 20 is biased toward and establishes an electrical connection with the LED terminals 36, solder need not be relied upon to establish an electrical connection. However, it is contemplated that solder could be used in conjunction with the LED interconnect spring clip assembly 20 without departing from the spirit of the invention. For example, it is contemplated that the contact features 24 may not directly contact the LED terminals 36 mechanically, but instead the contact features 24 could be connected to the LED terminals 36 through an intermediate connecting medium, such as wire bond potting.

The contact features 24 are preferably comprised of a spring material, such as spring steel or Beryllium-Copper (BeCu) over-plated with Nickel-Gold (Ni/Au), tin, or Nickel-Tin (Ni/Sn). Alternatively, the contact features 24 may be comprised of platable grade polymer and over-plated with Nickel-Gold (Ni/Au), Tin, or Nickel-Tin (Ni/Sn). As will be appreciated by those skilled in the art, other materials could also be used in constructing the contact features 24.

Figure 3B:
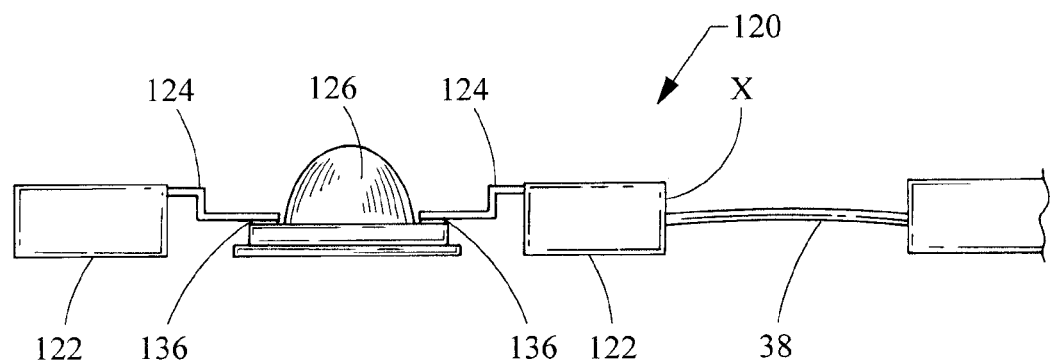
FIG. 3B is a cross-sectional view of another embodiment of an LED interconnect spring clip assembly embodying the principles of the present invention.

An LED interconnect spring clip assembly within the spirit of the present invention may have a variety of different configurations. Referring to FIG. 3B, a cross-sectional view of another embodiment of an LED interconnect spring clip assembly is shown at 120. As with the prior embodiment, the LED interconnect spring clip assembly 120 has contact features 124 molded into a housing 122. The contact features 124 are non-planar, taking the shape of a surface mount gull lead. The contact features 124 establish both an electrical and a mechanical connection with the LED terminals 136 and connect the LED terminals 136 to a wiring harness 38, which further connects the LED package 126 within a circuit (not shown). This occurs by virtue of the contact features 124 extending through the housing 122 to reach an edge X, where they may be connected to the wiring harness 38. Alternatively, the gull lead contact features 124 could be electrically connected to a circuit by soldering, bonding, welding, or metallurgically interconnecting them in another way to complete the circuit, obviating the need to connect them to a wiring harness 38. For example, the contact features 124 could be metallurgically connected to a circuit board located beneath them.

Figure 3C:
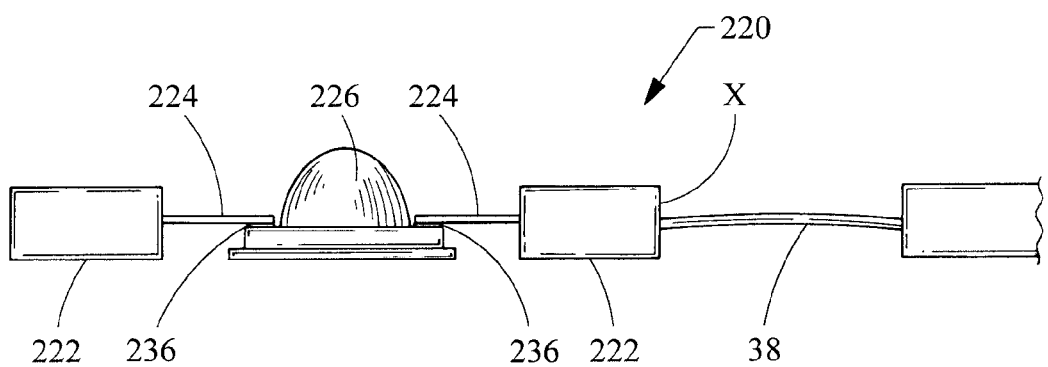
FIG. 3C is a cross-sectional view of yet another embodiment of an LED interconnect spring clip assembly embodying the principles of the present invention.

Referring to FIG. 3C, a cross-sectional view of yet another embodiment of an LED interconnect spring clip assembly is shown at 220. The LED interconnect spring clip assembly 220 has contact features 224 molded into the housing 222 and that are of a flat lead configuration. The contact features 224 contact the LED terminals 236, establishing both an electrical and a mechanical connection with the LED terminals 236.

Similarly to previous embodiments, the contact features 224 electrically connect the LED terminals 236 to a wiring harness 38, which further connects the LED package 226 within a circuit (not shown). For example, the contact features 224 extend through the housing 222 until they reach an edge X of the housing 22, where they may be connected to the wiring harness 38. The flat lead contact features 224 could alternatively be further connected within a circuit by soldering, bonding, welding, or metallurgically interconnecting them in another way to complete the circuit, obviating the need for a wiring harness 38.

Figure 3D:
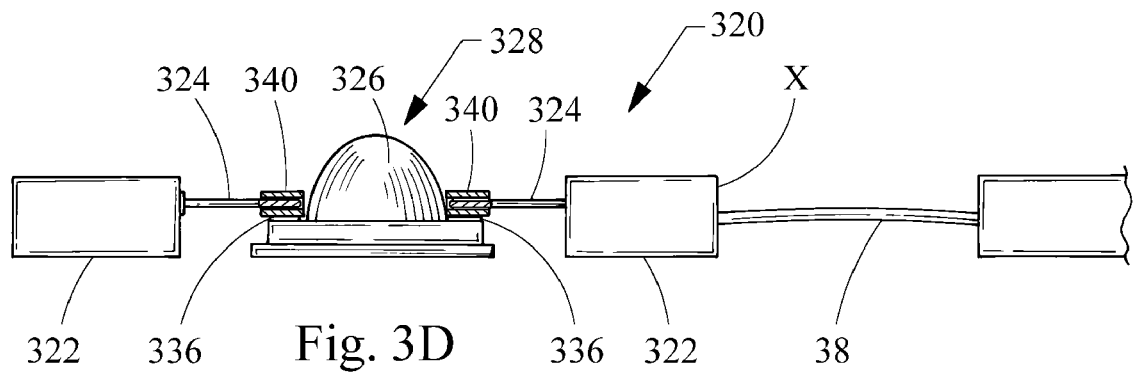
FIG. 3D is a cross-sectional view of yet another embodiment of an LED interconnect spring clip assembly embodying the principles of the present invention.

Referring to FIG. 3D, a cross-sectional view of yet another embodiment of an LED interconnect spring clip assembly is shown at 320. The contact features of this LED interconnect spring clip assembly 320 are in the form of pins 324 with one end molded into the housing 322 and the other end extending into the center cavity 328. In this embodiment, connectors 340 are attached to the LED terminals 336, and the pins 324 are inserted into the connectors 340, thereby both electrically and mechanically connecting the LED interconnect spring clip assembly 320 to the LED package 328.

As with other embodiments, the LED interconnect spring clip assembly 320 is further connected to a wiring harness 38, thereby electrically connecting the LED package within a circuit (not shown). This occurs by virtue of the pins 324 contacting internal contacts features that extend through the housing 322, or by the pins 324 themselves extending through the housing 322 to reach an edge X of the housing 322, where they may be connected to the wiring harness 38.

The pin-connector-configuration could take on various alternative designs, as one skilled in the art would appreciate. For example, the connectors 340 could be molded into the housing 322, and the pins 324 could be attached to the LED terminals 336.

Figure 3E:
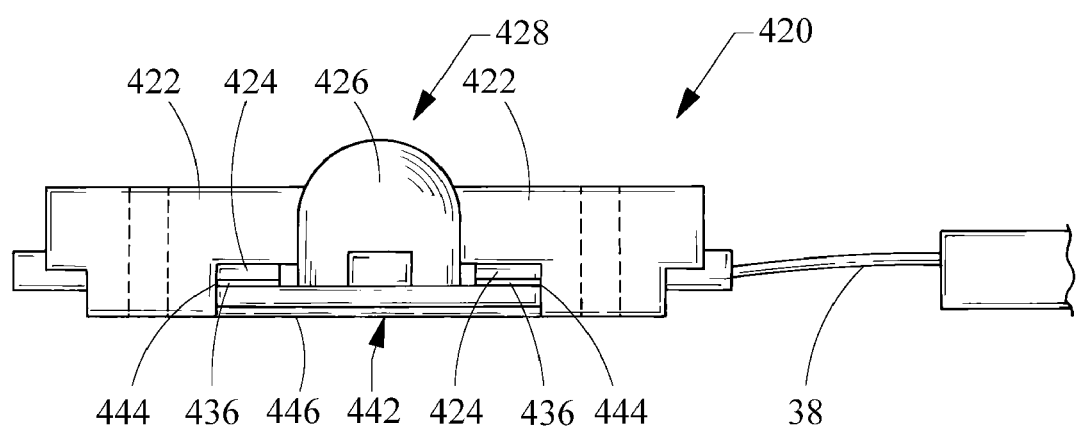
FIG. 3E is a cross-sectional view of yet another embodiment of an LED interconnect spring clip assembly embodying the principles of the present invention.

Referring to FIG. 3E, a cross-sectional view of yet another embodiment of an LED interconnect spring clip assembly contemplated by the present invention is shown at 420. The LED interconnect spring clip assembly 420 has contact features 424 in the form of flat leads. Alternatively, the contact features 424 could be of another configuration, such as a crimped configuration, providing for an interference fit to hold the LED package 26 between the contact features 424 and the heat sink 30 or other connecting surface. The contact features 424 may be integrally formed from platable grade polymer. The contact features 424 are over-molded with the plastic housing 422, and the resulting part is then plated with metal plating, such as Copper-Nickel-Gold (Cu/Ni/Au) or Nickel-Gold (Ni/Au), which adheres only to the platable grade polymer and not to the plastic housing 422. Alternatively, the contact features 424 could be plated before they are over-molded by the housing 422. The plastic housing 422 is preferably made of insulative, non-platable polymer.

When the LED interconnect spring clip assembly 420 is placed over an LED package 426, the contact features 424 contact the LED terminals 436 of the LED package 426, establishing both an electrical and a mechanical connection between the LED package 426 and the LED interconnect spring clip assembly 420. The LED interconnect spring clip assembly may then be electrically connected to a wiring harness 38 or otherwise provided within a circuit.

In the embodiment of FIG. 3E, a recess 442 is formed in the housing 422, so as to locate the LED package 426 within a center cavity 428 of the housing 422. The recess 422 preferably prevents movement of the LED package 426 along at least one axis and could also contain locating features operable to prevent movement laterally along two axes. The locating features in this embodiment may take the form of edges 444 of the recess 442 itself. Furthermore, in this embodiment, the recess 442 extends upward in the housing 422 far enough to allow a thermal interface material 446 to be included within the recess 442.

The LED interconnect spring clip assembly 420 of FIG. 3E generally has three functions. First, it establishes an electrical connection to connect the LED package 426 within a circuit. Second, it provides a mechanical compression to hold the LED package 426 in place along a z-axis. Third, it locates the LED package 426 along a y-axis and possibly an x-axis.

Figure 4A:
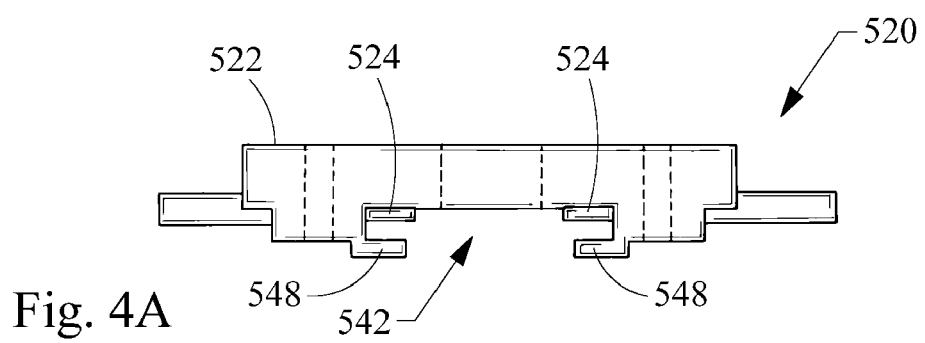
FIG. 4A is a side view of yet another embodiment of a portion of an LED interconnect spring clip assembly embodying the principles of the present invention.
Figure 4B:
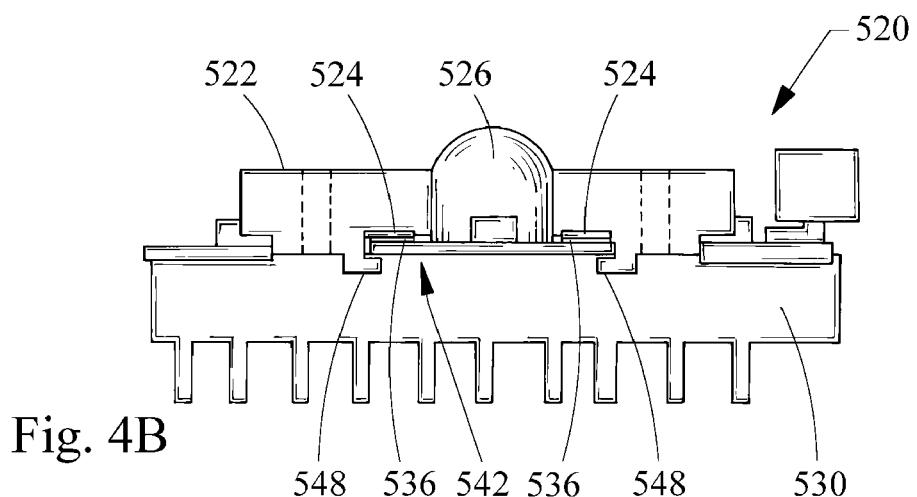
FIG. 4B is a cross-sectional view of the LED interconnect spring clip assembly of FIG. 4A, attached to a heat sink and having an LED package disposed therein.

In yet another embodiment of an LED interconnect spring clip assembly 520, as illustrated in FIGS. 4A-4B, the recess 542 of the housing 522 includes tabs 548 operable to fixedly attach the LED package 526 to the housing 522. The LED package 526 slides into place, and the tabs 548 fixedly hold the LED package 526 to the housing 522. The tabs 548 could also, or alternatively, be biased or otherwise configured to allow the LED package 548 to snap or wedge into place within the housing 522.

The contact features 524 of the LED interconnect spring clip assembly 520 of FIGS. 4A-4B contact the LED terminals 536 of the LED package 526, thereby electrically connecting the LED package 526 within a circuit. The contact features 524 can be flat leads (as shown in FIG. 4A-4B), or be of another configuration, such as corrugated contact features 24 (as shown in FIG. 3A). The other various features of the embodiment of FIGS. 4A-4B are similar to the features of the previous embodiments. For example the contact features 524 are operable to provide a mechanical compression to hold the LED package 526 in place, while also providing an electrical connection to the LED package 526. The LED interconnect spring clip assembly 520 is also shown attached to a heat sink 530.

Figure 5:
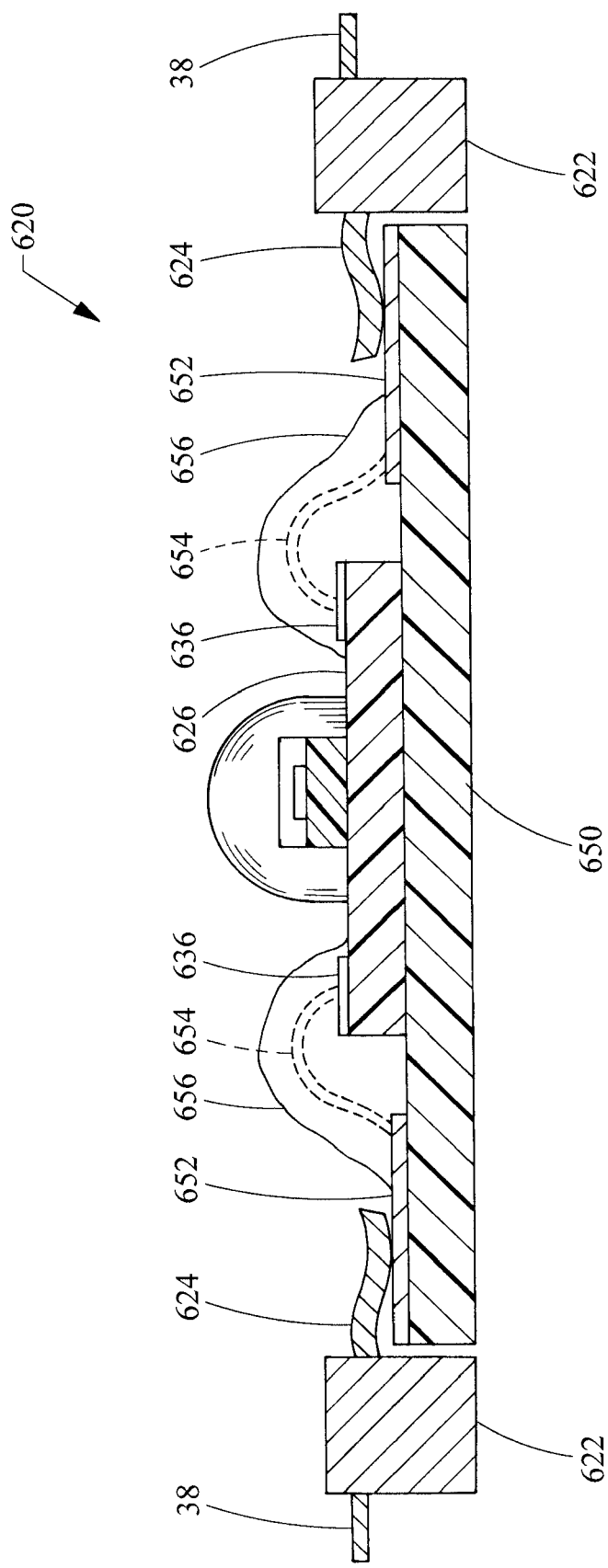
FIG. 5 is a cross-sectional view of yet another embodiment of an LED interconnect spring clip assembly embodying the principles of the present invention.

With reference to FIG. 5, an LED interconnect spring clip assembly 620 is provided that includes a carrier substrate 650, or heat sink, to which the LED package 626 is attached. The carrier substrate 650 could be FR-4 PCB, ceramic, or another desired substrate, as are known in the art. The substrate 650 can be square, rectangular, oval, hexagonal, or another suitable shape. In this embodiment of the invention, the LED package 526 is attached to the substrate 650 using glue, thermal adhesive, thermal grease, solder, or any other suitable method.

The LED terminals 636 are electrically connected to electric terminals 652 located on the substrate 650 using wire bonds 654. Any other suitable method of electrical connection, such as soldering, could also be used. In the present embodiment, wire bond potting 656 surrounds the wire bonds 654 and further holds the LED package 626 in place.

The contact features 624 of the LED interconnect spring clip assembly 620 contact the electric terminals 652 of the substrate 650, rather than directly contacting the LED terminals 636. In this way, the LED interconnect spring clip assembly 620 interconnects the substrate 650 and not necessarily the LED package 626 itself. The LED interconnect spring clip assembly 620 is otherwise similar to the previous embodiments, with the contact features 624 molded into the housing 622 and further connected to a wiring harness 38.

Figure 6:
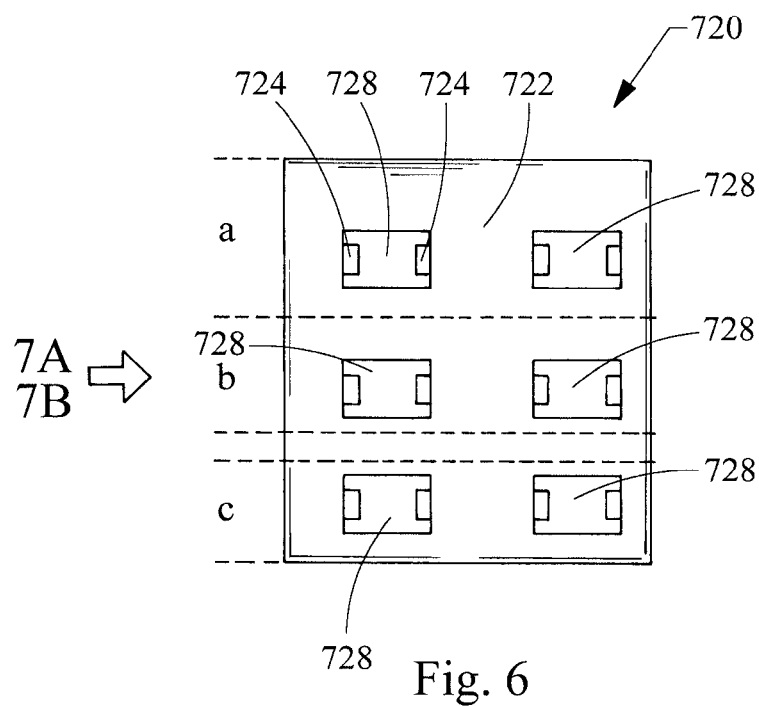
FIG. 6 is a plan view of yet another embodiment of an LED interconnect spring clip assembly, configured to receive multiple LED packages.

With reference to FIG. 6, an LED interconnect spring clip assembly 720 is provided that is configured for use with multiple LED packages. The housing 722 has multiple center cavities 728, each configured for use with an LED package. Alternatively, the housing 722 could have one large center cavity 728 through which multiple LED packages would protrude.

As in the previous embodiments, the LED interconnect spring clip assembly 720 has an electrically insulative housing 722, with contact features 724 molded therein to electrically connect the multiple LED packages to one or more wiring harnesses. This occurs by virtue of the contact features 724 extending through the housing 722 to connect to the wiring harness(es).

The contact features of the LED interconnect spring clip assembly 720 can be of various forms, similar to those shown in FIGS. 3A-3E. Furthermore, the housing 722 could have recesses, retention features, and/or tabs to hold the LED packages in place, as described above and shown in FIGS. 3E, 4A, and 4B. Furthermore, glue, thermal adhesive material, thermal grease, potting, or solder could be used with the LED packages between the LED packages and the substrates or heatsinks.

Figure 7A:
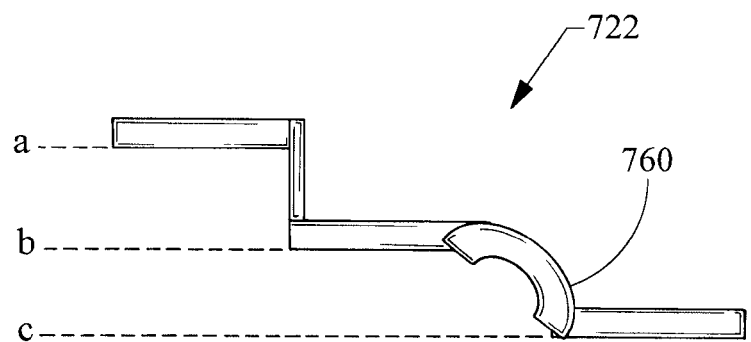
FIG. 7A is a side view of a first variant of the housing of the LED interconnect spring clip assembly of FIG. 6.
Figure 7B:
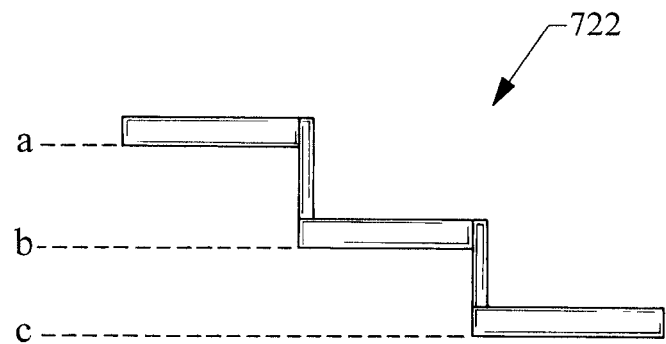
FIG. 7B is a side view of a second variant of the housing of the LED interconnect spring clip assembly of FIG. 6.

The housing 722 of FIG. 6 could have a variety of cross-sections in keeping with the spirit of the invention. For example, a simple variation could have a flat, planar cross section, with the LED packages attached to a flat, planar substrate. Alternatively, the cross-section of the housing 722 could be configured in a three-dimensional (3D) shape, in order to create a 3D configuration of LED packages, as illustrated in FIGS. 7A and 7B. With reference to FIG. 6, LED packages are provided so as to protrude through the center cavities 728 of the housing, with the LED packages lying along three planes: a, b, and c. The LED terminals of two LED packages lie along plane a, the LED terminals of another two LED packages lie along plane b, and the LED terminals of a third set of LED packages lie along plane c. As one skilled in the art will readily appreciate, the number of LED packages could be greater or fewer in number than the six LED packages that would correspond to the housing 722 of FIG. 6. For example, a tail-light configuration in an automobile would likely require more than six LED packages. Furthermore, the number of planes could be fewer or greater in number than the three planes a, b, and c that are illustrated in FIGS. 6, 7A, and 7B.

FIG. 7A also illustrates the possibility that the housing 722 could have a non-linear surface 760. Furthermore, it is contemplated that the housing could have an LED package protruding through a center cavity 728 located on the non-linear surface 760.

A contemplated method of assembling the LED interconnect spring clip assembly 20 involves molding the contact features 24 into the housing 22 and then forming the crimps or irregularities in the contact features 24, depending on the embodiment desired. The LED package 26 is attached to a vehicle structure, substrate, or heat sink 30 using glue, thermal adhesive 46, thermal grease, solder, or locating features, and the housing 22 is fastened over the LED package 26 using screws 34 or other suitable fasteners. The screws 34 secure the LED interconnect spring clip assembly 20 in place, creating the desired spring force between the contact features 24 and the LED terminals 36. Alternatively, as illustrated in the embodiment of FIGS. 4A-4B, the LED package 526 is attached to the housing 522 of the LED interconnect spring clip assembly 520, and the housing 522 is then attached to vehicle structure, substrate, or heat sink. A thermal interface material 46 is preferably placed between the LED package 26 and the heat sink 32 or other structure for ease of assembly, even if the LED package 26 is held in place by the housing 22 and/or contact features 24.

As a person skilled in the art will readily appreciate, the above description is meant as an illustration of implementation of the principles this invention. It should be understood that the invention could have a variety of embodiments other than those described herein in keeping with the spirit of the invention. This description is not intended to limit the scope or application of this invention in that the invention is susceptible to modification, variation and change, without departing from spirit of this invention, as defined in the following claims.

We claim:

1. An LED interconnect spring clip assembly comprising: an LED housing having at least one center cavity defined therein; and a plurality of contact features, each contact feature of the plurality of contact features having a portion retained by the housing and contacting the housing, and each contact feature of the plurality of contact features having an exposed portion operable to contact an LED terminal of an LED package disposed within the at least one center cavity; wherein each contact feature of the plurality of contact features is operable to bias the LED package to secure the LED package to a surface.

2. The LED interconnect spring clip assembly of claim 1, wherein each contact feature of the plurality of contact features has a portion molded into the housing.

3. The LED interconnect spring clip assembly of claim 1, wherein each contact feature is connected to a connecting feature, the connecting feature being operable to electrically connect the LED package to an external input voltage source.

4. The LED interconnect spring clip assembly of claim 1, wherein the exposed portion of each contact feature of the plurality of contact features is corrugated in shape.

5. The LED interconnect spring clip assembly of claim 1, wherein the exposed portion of each contact feature of the plurality of contact features is a pin, the pin being operable to be inserted within a connector that is attached to an LED terminal.

6. The LED interconnect spring clip assembly of claim 1, wherein the housing further comprises portions defining a recess operable to receive an LED package therein, the portions defining a recess including locating features operable to prevent movement of the LED package along at least one axis.

7. The LED interconnect spring clip assembly of claim 6, wherein the locating features are tabs operable to fixedly attach an LED package to the housing.

8. The LED interconnect spring clip assembly of claim 1, wherein each contact feature is comprised of one of the following: metal and metal-plated plastic.

9. An LED assembly comprising: An LED housing having at least one center cavity defined therein; at least one LED package having LED terminals, the at least one LED package being disposed within the at least one center cavity; a plurality of contact features, each contact feature of the plurality of contact features having a portion retained by the housing and engaging the housing, and an exposed portion in electrical communication with an LED terminal of the at least one LED package; wherein each of the contact features of the plurality of contact features biases the at least one LED package to secure the LED package to a surface.

10. The LED assembly of claim 9, wherein each contact feature of the plurality of contact features has a portion molded into the housing.

11. The LED assembly of claim 9, wherein each contact feature is connected to a connecting feature, the connecting feature being operable to electrically connect the LED package to an external input voltage source.

12. The LED assembly of claim 9, further comprising a substrate having a plurality of electric terminals, the at least one LED package being disposed upon the substrate, the at least one LED package being in electrical communication with at least two electric terminals of the plurality of electric terminals, and each contact feature contacting an electric terminal of the plurality of electric terminals.

13. The LED assembly of claim 9, wherein each contact feature of the plurality of contact features is in mechanical communication with an LED terminal, the mechanical communication being free of solder material.

14. The LED assembly of claim 9, wherein the housing has a non-planar cross-section.

15. The LED assembly of claim 9 comprising a plurality of LED packages, wherein the LED terminals of at least one LED package of the plurality of LED packages lie along a plane spaced apart from the plane of the LED terminals of at least one other LED package of the plurality of LED packages.

16. The LED assembly of claim 10, wherein each contact feature of the plurality of contact features is corrugated in shape.

17. The LED assembly of claim 10, wherein each contact feature of the plurality of contact features is a pin, the pins being inserted into connectors, the connectors each being attached to an LED terminal of the at least one LED package.

18. The LED assembly of claim 10, wherein the housing further comprises portions defining a recess operable to receive the at least one LED package therein, the portions defining a recess including locating features operable to prevent movement of the at least one LED package along at least one axis.

19. The LED assembly of claim 18, wherein the locating features are tabs operable to fixedly attach the at least one LED package to the housing.

20. The LED assembly of claim 10, wherein each contact feature is comprised of one of the following: metal and metal-plated plastic.

* * * * *

UNITED STATES PATENT AND TRADEMARK OFFICE
CERTIFICATE OF CORRECTION

| | |
|---|---|
| PATENT NO. | : 7,510,400 B2 |
| APPLICATION NO. | : 11/686101 |
| DATED | : March 31, 2009 |
| INVENTOR(S) | : Andrew Z. Glovatsky et al. |

Page 1 of 1

It is certified that error appears in the above-identified patent and that said Letters Patent is hereby corrected as shown below:

On the Title Page, Item (56)

Right col., line 4, after "Chiang" delete "et al.".

In column 8, claim 16, line 58, after "assembly of claim" delete "10" and substitute --9-- in its place.

In column 8, claim 17, line 61, after "assembly of claim" delete "10" and substitute --9-- in its place.

In column 8, claim 18, line 65, after "assembly of claim" delete "10" and substitute --9-- in its place.

In column 10, claim 20, line 1, after "assembly of claim" delete "10" and substitute --9-- in its place.

Signed and Sealed this

Fifteenth Day of September, 2009

David J. Kappos
*Director of the United States Patent and Trademark Office*